US005519781A

United States Patent [19]

Kukurudza

[11] Patent Number: 5,519,781

[45] Date of Patent: May 21, 1996

[54] SELF DAMPING SPEAKER MATCHING DEVICE AND METHOD

[76] Inventor: Vladimir W. Kukurudza, 12 Castille Crescent, Keswick, Ontario, Canada, L4P 3K9

[21] Appl. No.: 295,395

[22] Filed: Aug. 25, 1994

Related U.S. Application Data

[63] Continuation-in-part of Ser. No. 917,985, Jul. 24, 1992, Pat. No. 5,373,563, which is a continuation-in-part of Ser. No. 593,753, Oct. 5, 1990, abandoned.

[51] Int. Cl.[6] .............................. H04B 15/00; H03G 5/00

[52] U.S. Cl. .............................. 381/94; 381/96

[58] Field of Search .............................. 381/195, 204, 381/96, 94, 99–100, 111, 77

[56] References Cited

U.S. PATENT DOCUMENTS

| | | | |
|---|---|---|---|
| 1,645,282 | 10/1927 | Hanna | 179/180 |
| 1,674,683 | 6/1928 | Hahnemann | 381/96 |
| 1,992,300 | 2/1935 | Fanger | 381/195 |
| 2,194,175 | 3/1940 | Wilhelm | 381/96 |
| 2,897,291 | 7/1959 | Burke | 381/195 |
| 3,196,211 | 7/1965 | Kessenich | 381/195 |
| 3,766,334 | 10/1973 | Burke | 381/195 |
| 3,798,374 | 3/1974 | Meyers | 381/96 |
| 3,838,216 | 9/1974 | Watkins | 179/1 A |
| 4,034,165 | 7/1977 | Haeder | 381/204 |
| 4,107,479 | 8/1978 | Heil | 381/158 |
| 4,130,725 | 12/1978 | Nagel | 381/117 |
| 4,160,133 | 7/1979 | Wiik | 381/204 |
| 4,201,886 | 5/1980 | Nagel | 381/117 |
| 4,207,430 | 7/1980 | Harada | 179/1 F |
| 4,229,618 | 10/1980 | Gamble | 381/96 |
| 4,475,233 | 10/1984 | Watkins | 381/99 |
| 4,573,189 | 2/1986 | Hall | 381/96 |
| 4,597,100 | 6/1986 | Grodinsky et al. | 381/99 |
| 4,598,178 | 7/1986 | Rollins | 381/96 |
| 4,617,621 | 10/1986 | Kuroki | 363/71 |
| 4,718,100 | 1/1988 | Brisson | 381/77 |
| 4,727,584 | 2/1988 | Hall | 381/96 |
| 4,754,102 | 6/1988 | Dzurak | 174/36 |
| 4,945,189 | 7/1990 | Palmer | 174/32 |
| 5,373,563 | 12/1994 | Kukurudza | 381/94 |

FOREIGN PATENT DOCUMENTS

| | | | |
|---|---|---|---|
| 114011 | 9/1979 | Japan . | |
| 1254608 | 11/1971 | United Kingdom | 381/99 |

OTHER PUBLICATIONS

The Audio Cyclopedia pp. 367 to 385.

*Primary Examiner*—Stephen Brinich

[57] ABSTRACT

A damping circuit for speaker systems of the type containing at least one speaker having a speaker coil with an input and an output connection and having a matching coil adapted to be connected in series with the input connection of the speaker coil and a damping coil adapted to be connected in series with the output connection of the speaker coil, the matching and damping coils each having respective input and output ends, and being wound together in the same rotational direction with their respective input ends together and their respective output ends together in a method having a unity coefficient of coupling so that the primary signal current flows through both coils in the same direction, whereby electro-magnetic fields induced around the matching and damping coils interact with one another during passage of signals and damp out signal distortions due to induced transient signals in the matching coil and to reduce signal distortions due to induced transient signals in the speaker coil.

19 Claims, 4 Drawing Sheets

SELF DAMPING SPEAKER MATCHING DEVICE AND METHOD

This application is a continuation-in-part of application Ser. No. 07/917,985, filed Jul. 24, 1992, now U.S. Pat. No. 5,373,563, issued Dec. 3, 1994, which was in turn continuation-in-part of application Ser. No. 07/593,753 filed Oct. 5, 1990, now abandoned, entitled Self Camping Loudspeaker Circuit, inventor Vladimir W. Kukurudza.

FIELD OF THE INVENTION

The invention relates to loudspeakers, and in particular to a damping circuit for use in association with loudspeakers and, in particular, to a self-damping crossover circuit for use in multi-speaker audio systems.

BACKGROUND OF THE INVENTION

The problem of sound distortion in loudspeakers is well known. Generally it is detectable especially in the bass regions of sound reproduction as a form of "rumble", which muffles of masks the full purity of the bass tones. The problem also occurs in the mid-range and upper ranges of audio frequency reproduction, but is less noticeable to an untrained ear. This distortion is apparent in coil-driven loudspeaker systems having a single coil-driven loudspeaker, as well as those having a plurality of coil-driven loudspeakers. High fidelity audio loudspeaker system usually comprise at least two and more often, three or more separate coil-driven speakers. These speakers will include a speaker to cover the high frequency high notes (tweeter) and a speaker to cover the low frequency bass notes (woofer), and in most cases, a speaker to cover the mid-range frequency notes (mid-range). In some cases there may be multiple speakers for each range. It is customary in such multi-speaker systems to provide one or more filter circuits known as "crossovers" in which the signals for the various ranges are separated so that they are reproduced in the appropriate speakers in the system. Such crossovers incorporate one or more crossover coils as part of the filter circuit. The precise causes of the type of distortion described above are not entirely clear, however, it seems reasonable to assume that one source is the collapsing of the magnetic fields created around the crossover coil during the passage of signals. As the magnetic fields collapse, they induce, within the coil, a secondary transient signal related to, but not part of, the primary audio signal. Some evidence is available for this theory in the well-known relationship between the strength of the primary signal and the strength of the distortion signal. Various attempts have been made to deal with the problem.

One recent proposal is shown in U.S. Pat. No. 4,160,133. In this Patent, the speaker itself is manufactured with an additional damping coil mounted directly on the speaker. The degree of effectiveness of this solution has not been evaluated, but it is certain that the cost of manufacturing speakers incorporating this proposal would be considerably higher than the manufacture of conventional speakers, and the efficiency of the speaker is adversely affected. Thus such a solution would be less than optimal for the consumer. Consequently, this proposal has not achieved wide acceptance.

In general terms, the present invention finds its application both to single speakers and to such crossover circuits so that a damping effect is provided over a part of the frequency ranges or indeed all of the frequency ranges to damp out distortion.

It is believed that a major cause of speaker distortion is in the design of the crossover circuits themselves. Such crossover circuits inherently incorporate some form of coils, of varying inductances, whereby signals may be divided up into groups or bands of selected wavelengths for reproduction in the different speakers. It is, of course, well known that the passing of electrical current wave forms through a coil will result in the development-of transient electromagnetic fields around the coil itself. As the current fluctuates, so also does the induced electromagnetic field. The fluctuation of the induced electromagnetic field is believed to induce, in turn, a fluctuating voltage across the coil which is passed through the speaker coil producing a further unwanted movement and hence sound waves from the speaker. It is believed that this is a major cause of the distortions or so-called "rumble" which can be heard in speaker systems and this distortion is generally considered to be undesirable by the great majority of listeners.

It will of course be understood that in most of the speaker systems to which the invention relates, the speakers will be of the moving coil type. Such speakers inherently incorporate their own integral coil means. Such speaker coils will in themselves develop a back EMF, induced as the voice coil moves through the magnetic field of the permanent magnet which surrounds the voice coil. This factor is a "given" in almost all speaker systems, add may also be, in itself, a cause of distortion.

BRIEF SUMMARY OF THE INVENTION

With a view to providing a damping circuit for improved performance of speaker systems of the type containing at least one speaker means having input and output connection means, the invention comprises a damping circuit means comprising matching coil means defining matching coil input and output connection means, with said matching coil output connection means connectable with said speaker input connection means, damping coil means defining damping coil input and output connection means, with said damping coil input connection means connectable to said speaker output connection means, and said matching and damping coil means being wound together on a common support with the turns of one coil alternating with the turns of the other coil, with their said input connection means adjacent one another and their said output connection means adjacent one another whereby currents will flow through said matching and damping coil means in the same direction and whereby transient signals in a respective first one of said matching and damping coils set up magnetic fields around the common support means which fields then induce out of phase transient signals in the respective second of said matching and damping coils, said induced out of phase transient signals acting to reduce in strength, or damp, the initial transient signals.

The invention further comprises a method of damping audio signals in a speaker system, by passing the same through a damping circuit means, the damping circuit means having matching coil means and damping coil means, said matching and damping coil means each having a first coil end and a second coil end, and having respective input and output connection means, said matching coil means and damping coil means being wound together about a common support and having respective input connection means at coincident first coil end, and having respective output connection means at respective coincident second coil end; said matching coil means and damping coil means being wound in a manner to provide unity coefficient of coupling between said matching and damping coil means, said matching coil connected in series with a coil driven speaker having input connection means and output connection means, with said matching coil output connection means being connected to the input connection means of the loudspeaker and, said damping coil means being connected in series with the same coil driven loudspeaker, and having speaker output connection means connected to damping coil input connection means in such a manner as to provide a continuous circuit between the matching coil input connection means and the damping coil output connection means, whereby currents will flow through said matching and damping coil means in the same direction whereby transient signals in a respective first one of said matching and damping coils set up magnetic fields which fields then induce out of phase transient signals in the respective second of said matching and damping coils, said induced out of phase transient signals acting to reduce in strength, or damp, the initial transient signals.

A further feature is that said matching coil may be of a first predetermined inductance and said damping coil may be of a second predetermined inductance different from said matching coil means.

A further features is that variable means may be provided for varying the inductance of one of the matching and damping coils relative to the other.

A further feature is such a speaker system wherein there are at least, high frequency speaker means and low frequency speaker means, and incorporating a first high frequency damping circuit for said high frequency speaker means and further a low frequency damping circuit for said low frequency speaker means, A further feature is such a system wherein there are at least three separate speakers in each speaker system, and there being respective damping circuit for said speakers in said speaker system.

The matching and damping coils are preferably formed with equal numbers of turns or windings in each coil, with the individual turns of one coil being separated by the individual turns of the other coil, wound on a common support. There are several layers of windings with the turns of one coil in one winding layer overlying the turns of the other coil in the next adjacent winding layer.

The various features of novelty which characterize the invention are pointed out with particularity in the claims annexed to and forming part of this disclosure. For a better understanding of the invention, its operating advantages and specific objects attained by its use, reference should be had to the accompanying drawings and descriptive matter in which there are illustrated and described preferred embodiments of the invention.

DESCRIPTION OF A SPECIFIC EMBODIMENT

Figure 1:
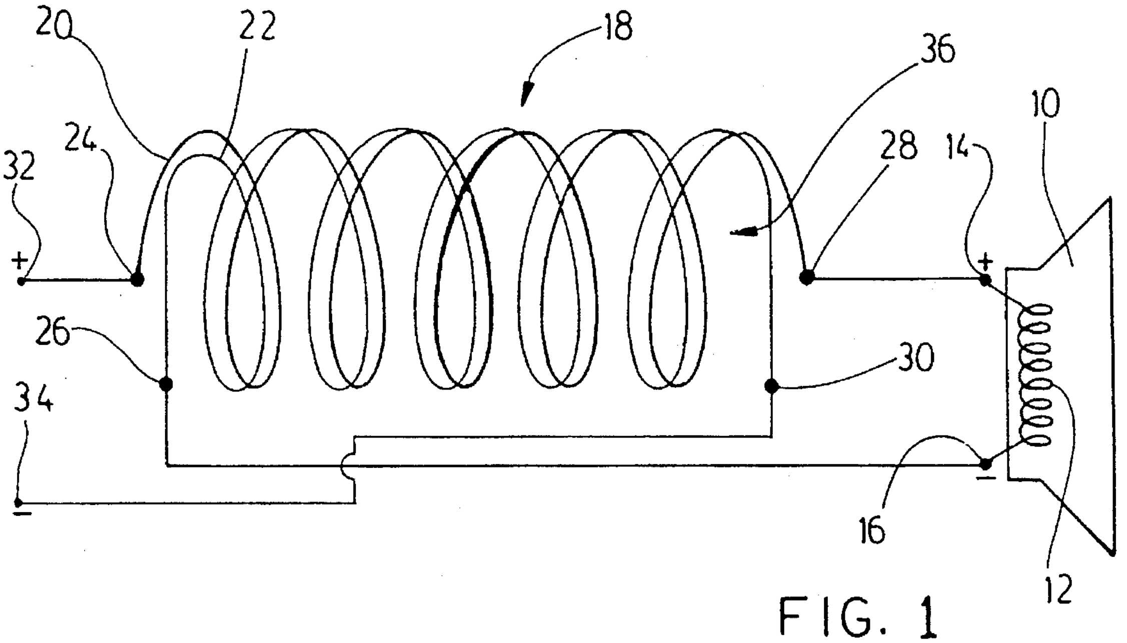
FIG. 1 is an electrical circuit diagram showing a single damping circuit in accordance with the invention for application to a single speaker.
Figure 2:
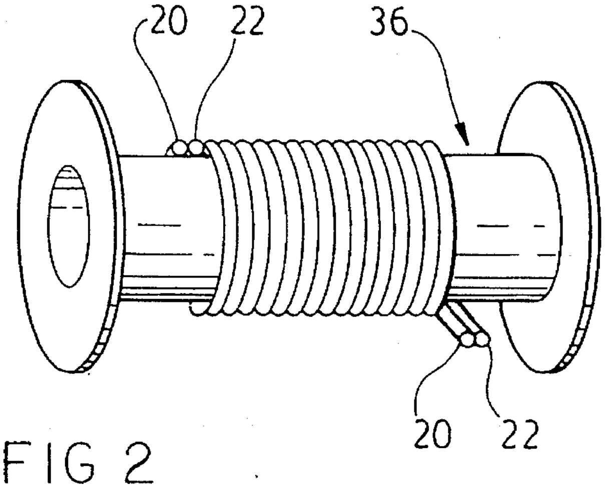
FIG. 2 is a detail of the bifilar winding of the matching coil and the damping coil of the invention.
Figure 3:
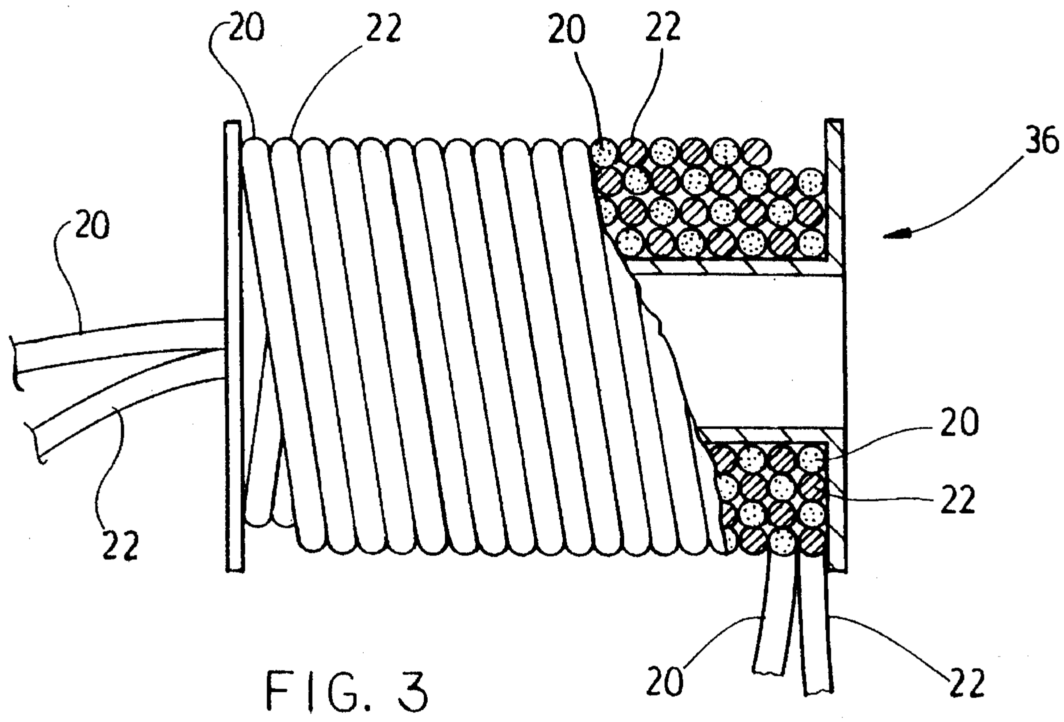
FIG. 3 is a side elevation of FIG. 2, partially cut away.

Referring first of all to FIG. 1, it will be seen that the invention is there illustrated in connection with a speaker system comprising a single speaker 10 having an integral voice coil 12 and speaker input connection means 14 and speaker output connection means 16. The damping circuit 18 provides a matching coil 20 coil and a damping coil 22, each having respective input connection means 24, 26 and having respective output connection means 28, 30. Matching coil 20 and damping coil 22 are wound in a mode known as "unity coefficient of coupling", in bifilar style i.e. two conductors of the same or very nearly the same thickness placed adjacent one another and wound on a common support means 36 as illustrated in FIG. 2 and 3. In this form of winding as shown in FIGS. 2 & 3, each wire loop of matching coil 20 alternates with and is separated by a respective wire loop of damping coil 22.

The matching and damping coils are preferably formed with equal numbers of turns or windings in each coil, with the individual turns of one coil being separated by the individual turns of the other coil, wound on a common support. There are several layers of windings with the turns of one coil in one winding layer overlying the turns of the other coil in the next adjacent winding layer.

As FIGS. 2 & 3 indicate, matching and damping coils 20, 22 are wound about a common support means such as 36. Common support 36 maybe for example, a bobbin, of plastic or the like (FIGS. 2 & 3), having non-magnetic properties, or in some cases may be formed of iron-steel, nickel-steel, or any other support means which may be advantageous in a given situation.

In FIG. 3, the turns of coil 20, where they are cut away, are shown with speckle hatching. The turns of coil 22 are shown with diagonal line hatching. It will be seen that the turns of coil 22 in one winding layer, overlay the turns of coil 20 in the next adjacent winding layer, and so on.

FIG. 3 also illustrates the two ends of the coil 20, adjacent to the two ends to the coil 22.

The two adjacent ends would constitute the input of the two coils and the other two adjacent ends would constitute the output of the two coils.

In operation, it will be appreciated that the driving circuit will supply power via the input 32 which is connected to matching coil input connection means 24. matching coil output connection means 28 is connected to speaker input connection means 14 and power passes through integral voice coil 12 to speaker output connection means 16. Power then flows from speaker output connection means 16 to damping coil input connection means 26, through damping coil 22 to damping coil output connection means 30 from whence it passes to the negative side of the driving circuit 34.

It is believed that the damping circuit as herein described relies on induced currents to function. As a signal is fed into the circuit moving first through the matching coil, a very nearly equal current is induced in the damping coil. The current induced in the damping coil would, however, be approximately 180 degrees out of phase with that passing through the matching coil if the coils were merely shorted out. In other words, the two currents, when added, would very nearly cancel one another. If the speaker was removed from the damping circuit, and a current was applied, with a measuring instrument such as a galvanometer connected between the coil output connection means, there would be a very limited electrical potential measured.

However the presence of the loudspeaker coil in the circuit provides a phase shift of approximately 90 degrees in the current flowing through the circuit. It is believed that this phase shift allows the damping circuit means to perform its job of damping transient signals induced in the system without impairing the quality of the original, sound signal.

There are three different electrical signals which are easily identified and flow within the standard speaker circuit at a given instant. The first is the primary signal or applied voltage. The second is the induced current created by the passage of the primary current through the standard crossover coil, believed to be one source of noise or distortion. The third is the "back EMF" produced in the voice coil of the loudspeaker, believed to be another source of noise or distortion. It is believed that the design of the present damping circuit provides, for each of the second and third unwanted noise signals in the circuit, a very nearly equally strong signal which is 90 degrees out of phase with the respective noise signals.

Furthermore the damping coil provides a magnetic braking effort on the voice coil of the speaker. This causes the voice coil to move almost exclusively in response to the primary signal, and dampens any movement of the voice coil which would otherwise give rise to unwanted noise sounds and obscure subtle sounds in the primary signal.

The invention further comprises a method of damping audio signals in a speaker system, by passing the same through a damping circuit means, said damping circuit means comprising matching coil means and damping coil means, said matching and damping coil means each having a first coil end and a second coil end, and having respective input and output connection means, said matching coil means and damping coil means being wound together about a common support and having respective input connection means at coincident first coil end, and having respective output connection means at respective coincident second coil end; said matching coil means and damping coil means being wound in a manner to provide unity coefficient of coupling between said matching and damping coil means, said matching coil connected in series with a coil driven speaker having input connection means and output connection means, with said matching coil output connection means connected to the input connection means of the loudspeaker, said damping coil means being connected in series with the same coil driven loudspeaker and having the speaker output connection means connected to the damping coil input connection means in such a manner as to provide a continuous circuit between the matching coil input connection means and the damping coil output connection means, whereby currents will flow through said matching and damping coil means in the same direction thereby acting to reduce in strength, or damp, the unwanted signals.

Figure 4:
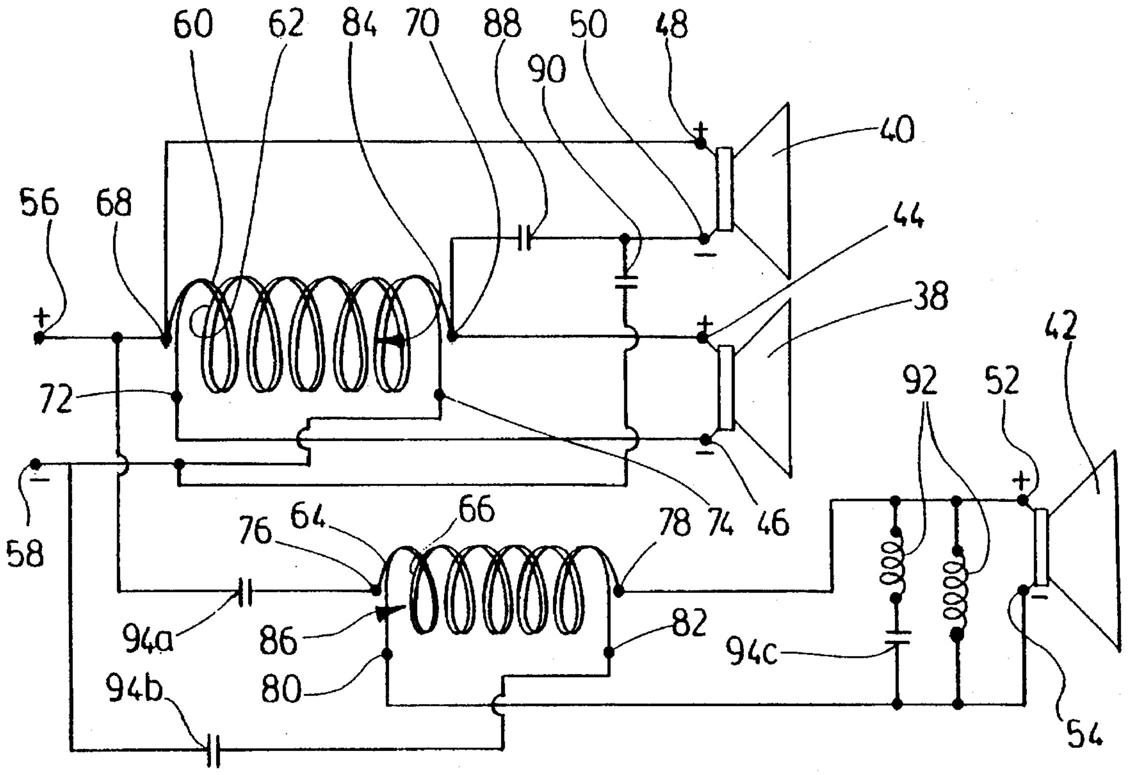
FIG. 4 is an electrical circuit diagram illustrating a typical audio loudspeaker system comprising a plurality of speakers and showing damping circuits according to the invention.

More frequently, the invention will be used in a speaker system employing a plurality of loudspeakers interconnected through a matching circuit. By way of illustration FIG. 4 shows the invention in a system having three separate speakers, namely, a low frequency speaker 38, a mid-range frequency speaker 40, and a high range frequency speaker 42. Each of the speakers is of the moving coil type, and the speakers are together intended to handle the entire audible range of sound waves, with, in most cases, a certain degree of overlap between the adjacent speakers, in a manner well known in the art and requiring no description. Low range frequency speaker 38 has an input 44 and an output 46, indicated respectively as positive and negative. The mid range speaker 40 has an input connection 48 and an output connection 50 indicated respectively as positive and negative. The high range frequency speaker 42 has an input connection 52 and an output connection 54 indicated respectively as positive and negative.

It is assumed that the speaker system comprising the three speakers 38, 40, and 42 is intended to be connected to a source of audio frequency signals, coming from a suitable source such as some form of sound reproduction device either a disc or tape type device, or for example from a radio receiver, or directly for example from a microphone or series of microphones with amplifiers and other equipment as needed (not shown). All of these different systems are vary well known in the art and require no further description.

The connections for such systems are indicated generally as 56 and 58 being indicated respectively as positive and negative. As is well known in the art, in the normal speaker system, there would be, between the main connections 56 and 58, and the speakers 38, 40, and 42 a series of what are known as "crossover" circuits. The purpose of the crossover circuits is to filter out or separate the high-frequency, mid-range, and low-frequency signals, so that they are directed to the appropriate speakers for reproduction therein, and are excluded from the other speakers. As mentioned, in most crossover circuits; and speaker systems, some small degree of overlap is provided, the exact degree being dependant upon the design of the speakers and the requirements of the system, all as is well known in the art. It will be appreciated that in FIG. 4 no such typical prior art crossover circuits are illustrated.

In place of the conventional crossover circuits, there are provided, in this example, low range matching and damping coils 60 and 62, and high range matching and damping coils 64 and 66. Low range matching coil 60 has an input 68 and an output 70 and low range damping coil 62 has an input 72 and an output 74. High range matching coil 64 has an input 76 and an output 78. High range damping coil 66 has an input 80 and an output 82. Each of the respective pairs of coils 60–62 and 64–66 are wound in a bifilar manner concentrically together about respective common support means (indicated generally as 84 and 86) as shown and as described above (FIGS. 2 and 3), providing unity coefficient of coupling. The inputs of the coils adjacent one another at respective first matching and damping coil ends, and their outputs are adjacent one another at respective second matching and damping coil ends. Low range matching coil 60 is connected with its input 68 connected to the input side of the driving circuit 56. The output 70 of low range matching coil 60 is connected to the input side 44 of low range speaker 38. The input 72 of low range damping coil 62 is connected to the output 46 of low range speaker 38. The output 74 of low range damping coil 62 is connected to the negative side 58 of the driving circuit. In this way, the currents flowing through the matching coil 60, and the damping coil 62 both input from the same adjacent ends, at input 68 and 72, and output at two adjacent ends 70 and 74. Both coils being wound in the same direction, the two coils thus carry their respective currents from their input ends to their output ends, around windings being wound in the same direction.

A suitable condenser 88 is incorporated where necessary, in the connection between the output 50 of mid range speaker 40, and the input 44 of low range speaker 38. In addition, a further connection, together with a condenser 9O, extends between the output 50 of mid range speaker 40, and the negative side 58 of the driving circuit.

In the high range matching and damping coils 64 and 66, the input 76 of high range matching coil 64 is connected to the positive side 56 of the driving circuit through condenser 94*a*.

The output 78 of high range matching coil 64 is connected to the input 52 of the high range speaker 42. The input 80 of high range damping coil 66 is connected to the output 54 of the high range speaker 42. The output 82 of the high range damping coil 66 is connected through a condenser 94*b* to the negative side 58 of the driving circuit. The coils 64 and 66 are wound and connected in the same manner as described in connection with coils 60 and 62, so that currents flow through the respective coils from their respective inputs to their respective outputs, around coils being wound in the same direction.

Suitable auxiliary coils 92, and condenser 94*c* are provided to filter super-sonic transients.

Figure 5:
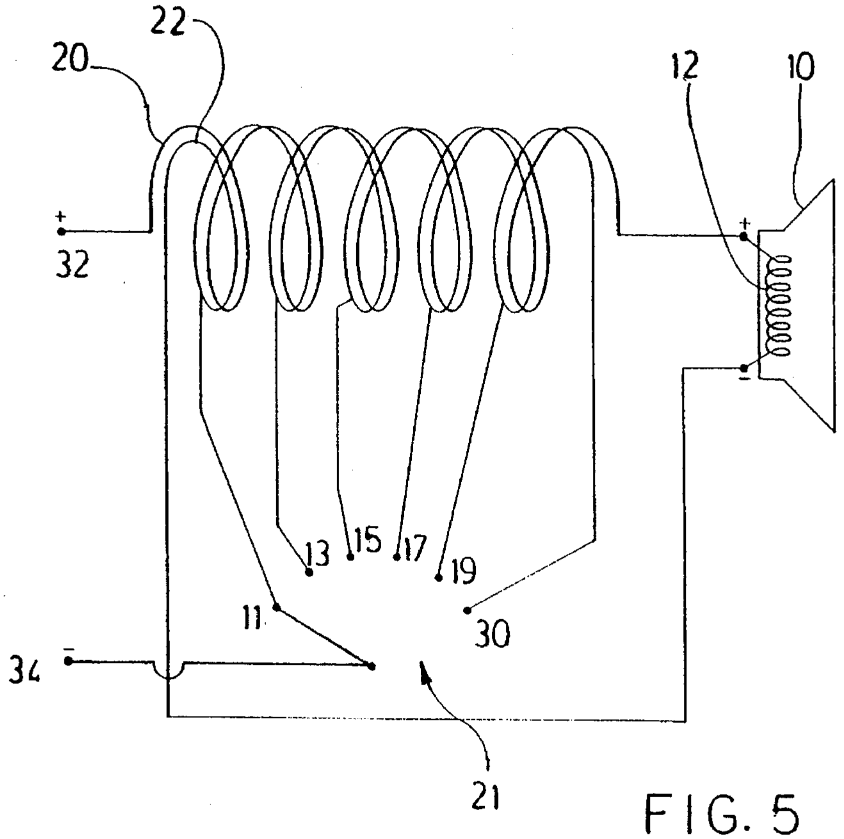
FIG. 5 is an electrical circuit diagram showing a damping circuit according to the invention provided with a variable tapping on the windings of the damping coil means whereby the inductance of that coil may be charged.

FIG. 5 is an example of a variant of the damping circuit. It may be desirable for the user to control the inductance of the damping coil, thereby altering the performance of the damping circuit. In order to vary the inductance of the damping coil, a series of tappings 11, 13, 15, 17, and 19 are provided along the damping coil. These tappings are connected into multi-position selector switch indicated generally as 21. Selector switch 21 provides a convenient method of altering the connection point of the outlet side 34 of the driving circuit and damping coil thereby altering the number of effective windings of damping coil 22 and hence its inductance. It can be appreciated that damping circuits having variable tappings may be utilised in multi-speaker systems such as those shown in FIG. 4, FIGS. 6 and 7.

Figure 6:
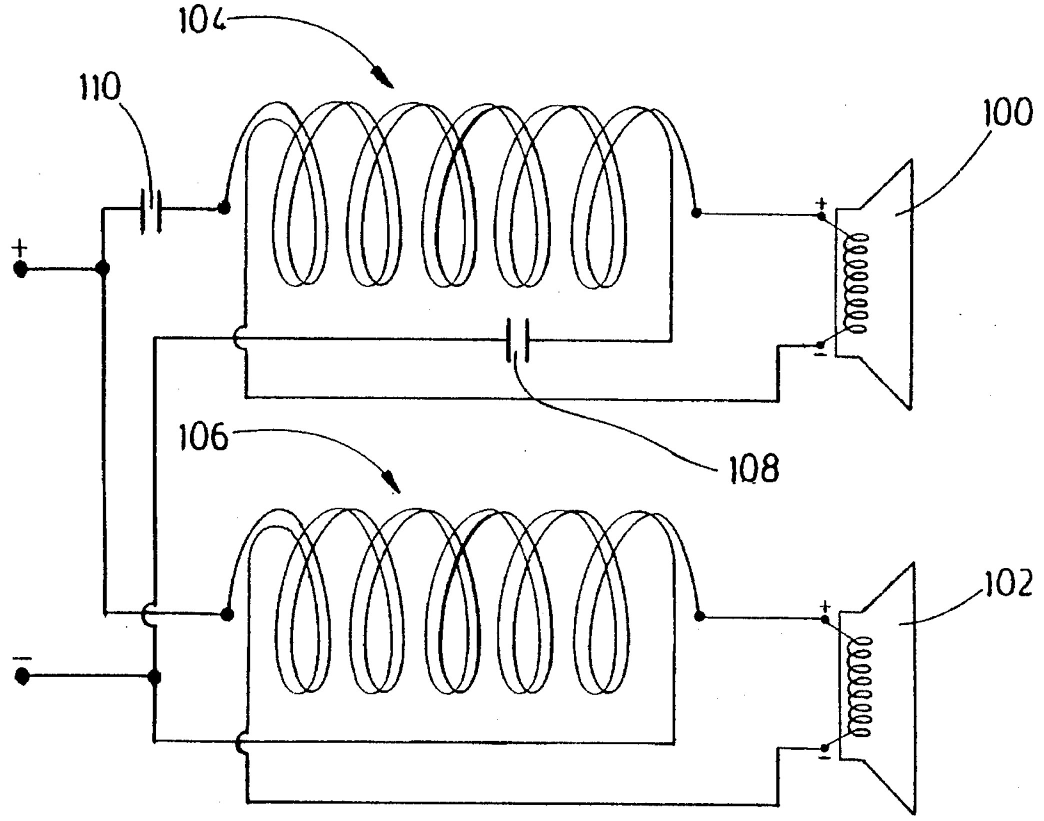
FIG. 6 is a diagram showing a further preferred embodiment for two speakers, and, FIG. 7 is a diagram showing a further preferred embodiment for three speakers.

FIG. 6 is a diagram of a further preferred embodiment of the inventive circuit in a loudspeaker system having two speakers namely a high and middle range frequency speaker 100, and a low range frequency speaker 102. The benefits of providing different speakers for the reproduction of different frequency ranges are well known in the art and therefore will not be described here. Each speaker is provided with a damping circuit, indicated generally as 104, and 106 arranged, and connected, in the manner described in respect of FIGS. 1 and 4. In the circuit of FIG. 6, capacitors 108, 110 are connected in the circuit to filter unwanted frequencies from respective speakers.

Figure 7:
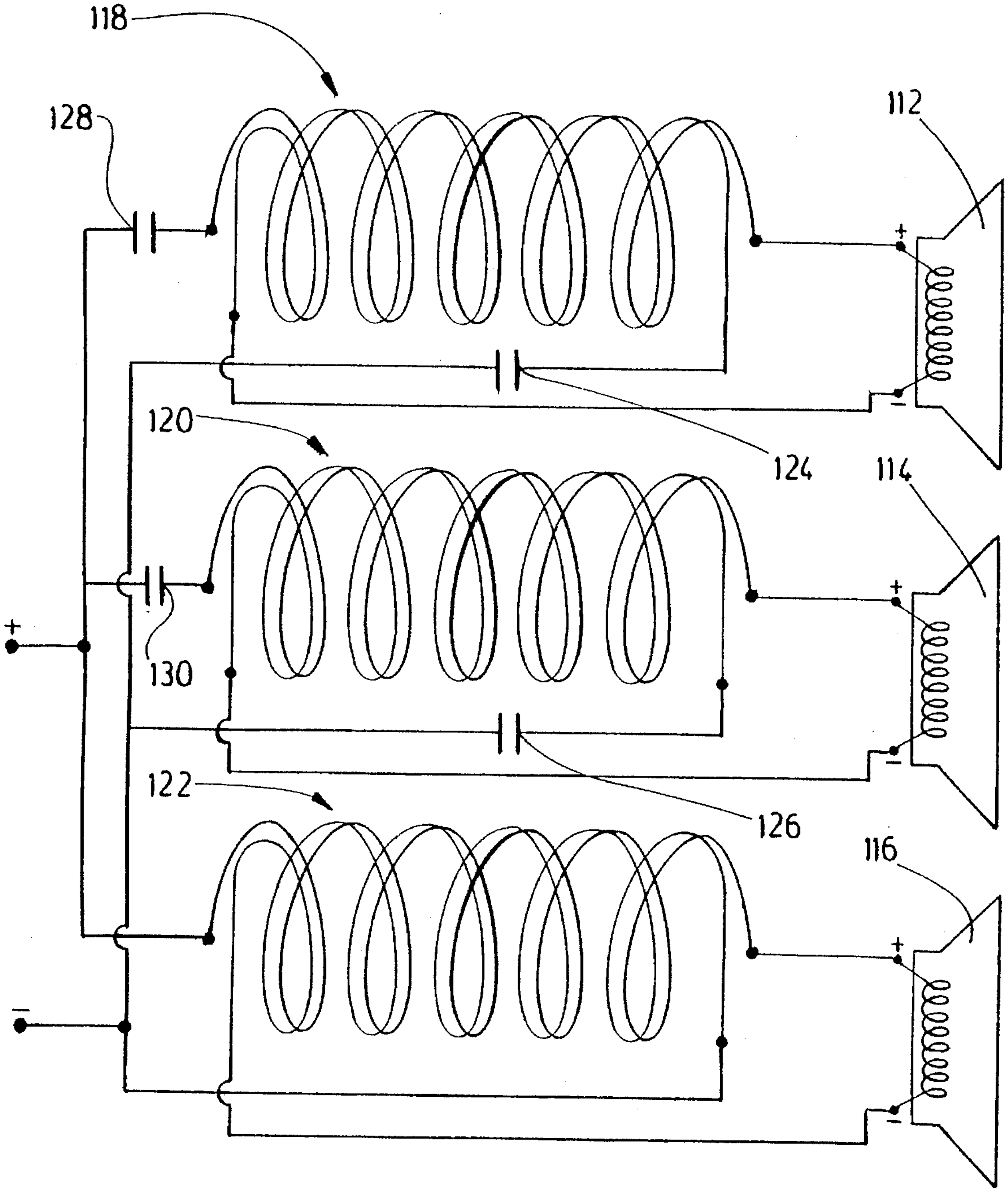

FIG. 7 is a diagram of a further preferred embodiment of the inventive circuit in a loudspeaker system having three speakers namely, a high frequency speaker 112, a middle range frequency speaker 114, and a low range frequency speaker 116. The benefits of providing different speakers for the reproduction of different frequency ranges are well known in the art and therefore will not be described here. Each speaker is provided with a damping circuit, indicated generally as 118, 120, 122 arranged, and connected in the manner described in connection with FIGS. 1 and 4. In the circuit of FIG. 7, capacitors 124, 126, 128, 130 are connected in the circuit to filter unwanted frequencies from respective speakers.

The foregoing is a description of a preferred embodiment of the invention which is given here by way of example only. The invention is not to be taken as limited to any of the specific features as described but comprehends all such variations thereof as come within the scope of the appended claims.

What is claimed is:

1. A damping circuit for reducing noise signals in speaker systems of the type containing at least one coil driven speaker having a predetermined inductance and input and output connection, for reproducing audio signals and comprising;

a matching coil having a predetermined inductance defining matching coil input and output connection means;

a damping coil having a predetermined inductance defining damping coil input and output connection means;

said matching and damping coils defining windings being wound together in the same direction, about a common core, with their said input connection means juxtaposed to one another and with their said output connection means juxtaposed one another whereby currents will flow through said matching and damping coils in the same direction, from their said inputs to their said outputs, whereby to at least partially damp out noise signals.

2. A damping circuit as claimed in claim 1 wherein said matching and damping coils are of equal inductance to one another.

3. A damping circuit as claimed in claim 1 wherein said matching coil and said damping coil are of differing inductance.

4. A damping circuit as claimed in claim 1 wherein means are provided for varying the inductance of said damping coil.

5. A damping circuit as claimed in claim 1 wherein there are at least, high frequency coil driven speaker means and low frequency coil driven speaker means and including high frequency matching and damping coils for said high frequency coil driven speaker means and low frequency matching and damping coils for said low frequency coil driven speaker means.

6. A damping circuit as claimed in claim 5 wherein there are at least three separate coil driven speaker means in each speaker system, and there being respective pairs of matching and damping coils for at least two of said coil driven speaker means in said speaker system.

7. A damping circuit as claimed in claim 1 wherein said matching and damping coils define an equal number of windings.

8. A damping circuit as claimed in claim 1 wherein said matching coil is of an inductance suitable to filter out unwanted frequencies of electrical signals.

9. A damping circuit as claimed in claim 1 wherein said matching coil and said damping coil are wound together in a bi-filar manner, on a common support.

10. A method of damping distortion in audio signals in an audio speaker system including coil driven speaker means comprising the steps of;

passing the audio signals through damping circuit means, said damping circuit means comprising, a matching coil and a damping coil;

said matching and damping coils each having a first coil end and a second coil end, and having respective input and output connection means;

said matching coil and damping coil being wound together about a common support and having respective input connection means at a coincident first coil end, and having respective output connection means at a respective coincident second coil end;

said matching coil and damping coil being wound in a manner to provide unity coefficient of coupling between said matching and damping coils;

said matching coil being connected in series with a coil driven speaker having input connection means and output connection means, with said matching coil output connection means connected to said input connection means of said speaker;

said damping coil being connected in series with the same coil driven speaker and having speaker output connection means connected to damping coil input connection means in such a manner as to provide a continuous circuit between the matching coil input connection means and the damping coil output connection means;

whereby currents will flow through said matching and damping coils in the same direction and thereby at least partially damp out said noise signals.

11. A method of damping distortion as claimed in claim 10 including the step of varying the inductance of said damping coil.

12. A method of damping distortion as claimed in claim 10 in which at least three separate coil driven speaker means are provided in each speaker system, there being respective pairs of matching and damping coils for at least two of said coil driven speaker means in said speaker system.

13. A method of damping distortion as claimed in claim 10 in which said audio speaker system comprises a plurality of coil driven speaker means each coil driven speaker means provided with a damping circuit as described.

14. An audio signal reproduction system for reproducing audio signals from a source of audio signals and comprising;

at least one coil driven speaker means having input and output connection means for input and output of audio signals thereto;

a matching coil having a predetermined inductance and defining matching coil input and output connections, said matching coil input connection being connected in series with said audio signal source and said matching coil output connection being connected in series with said input connection of said coil driven speaker means;

a damping coil having a predetermined inductance and defining damping coil input and output connections, said damping coil input connection being connected in series with said output connection of said coil driven speaker means and said damping coil output connection being connected in series with said audio signal source;

said matching and damping coils defining windings being wound together in the same rotational direction, about a common support means, with their said input connections adjacent one another and their said output connections adjacent one another whereby currents will flow through said matching coil and said speaker coil and said damping coil in series and whereby said currents will flow through said matching coil and said damping coil in the same rotational direction.

15. An audio signal reproducing system as claimed in claim 14 and wherein said matching and damping coils are of equal inductance to one another.

16. An audio signal reproducing system as claimed in claim 14 wherein means are provided for varying the inductance of said damping coil.

17. An audio signal reproducing system as claimed in claim 14 wherein there are at least, a high frequency coil driven speaker means and a low frequency coil driven speaker means and including high frequency matching and damping coils for said high frequency coil driven speaker means and low frequency matching and damping coils for said low frequency coil driven speaker means.

18. An audio signal reproducing system as claimed in claim 14 and wherein said matching and damping coils define an equal number of windings wound together in the same rotational direction.

19. An audio signal reproducing system as claimed in claim 14 wherein said matching coil and said damping coil are wound together in a bi-filar manner in the same rotational direction.

* * * * *